United States Patent
Kuriyama (10) Patent No.: US 7,714,637 B2
(45) Date of Patent: May 11, 2010

(54) NEGATIVE POTENTIAL DISCHARGE CIRCUIT AND METHOD THEREOF

(75) Inventor: Masao Kuriyama, Yokohama (JP)

(73) Assignee: Samsung Electronics Co., Ltd., Gyeonggi-do (KR)

(*) Notice: Subject to any disclaimer, the term of this patent is extended or adjusted under 35 U.S.C. 154(b) by 218 days.

(21) Appl. No.: 11/812,927

(22) Filed: Jun. 22, 2007

(65) Prior Publication Data

US 2007/0297242 A1    Dec. 27, 2007

(30) Foreign Application Priority Data

Jun. 23, 2006    (JP) .................. 10-2006-0174319

(51) Int. Cl.
    *G05F 3/02*    (2006.01)
(52) U.S. Cl. .................. 327/537; 323/267; 365/226
(58) Field of Classification Search ......... 327/535–540; 363/58–65; 365/189.01, 189.07, 189.09, 365/185.25–185.29; 323/265–272
    See application file for complete search history.

(56) References Cited

U.S. PATENT DOCUMENTS 5,627,458 A * 5/1997 Nevin .................. 323/267
5,920,226 A * 7/1999 Mimura .................. 327/537

* cited by examiner

*Primary Examiner*—Rajnikant B Patel
(74) *Attorney, Agent, or Firm*—Harness, Dickey & Pierce, P.L.C.

(57) ABSTRACT

A negative potential discharge circuit may include an internal voltage generating circuit and/or a discharge unit. The internal voltage generating circuit may be configured to generate a regulated output voltage based on a power supply voltage. The discharge unit may be configured to discharge a negative potential using the regulated output voltage. A method of discharging a negative potential may include generating a regulated output voltage based on a power supply voltage, and/or discharging a negative potential using the regulated output voltage.

17 Claims, 5 Drawing Sheets a b

NEGATIVE POTENTIAL DISCHARGE CIRCUIT AND METHOD THEREOF

PRIORITY STATEMENT

This application claims priority under 35 U.S.C. §119 to Japanese Patent Application No. 2006-0174319, filed on Jun. 23, 2006, in the Japanese Patent Office, the entire contents of which are incorporated herein by reference.

BACKGROUND

A parasitic capacitance may be formed between nodes of a memory cell of a NOR flash memory array. As the size of the memory array increases with an increase in a memory capacity, the parasitic capacitance may also increase. This increased parasitic capacitance may affect applying/discharging of an erase voltage in an erase operation.

Figure 2:
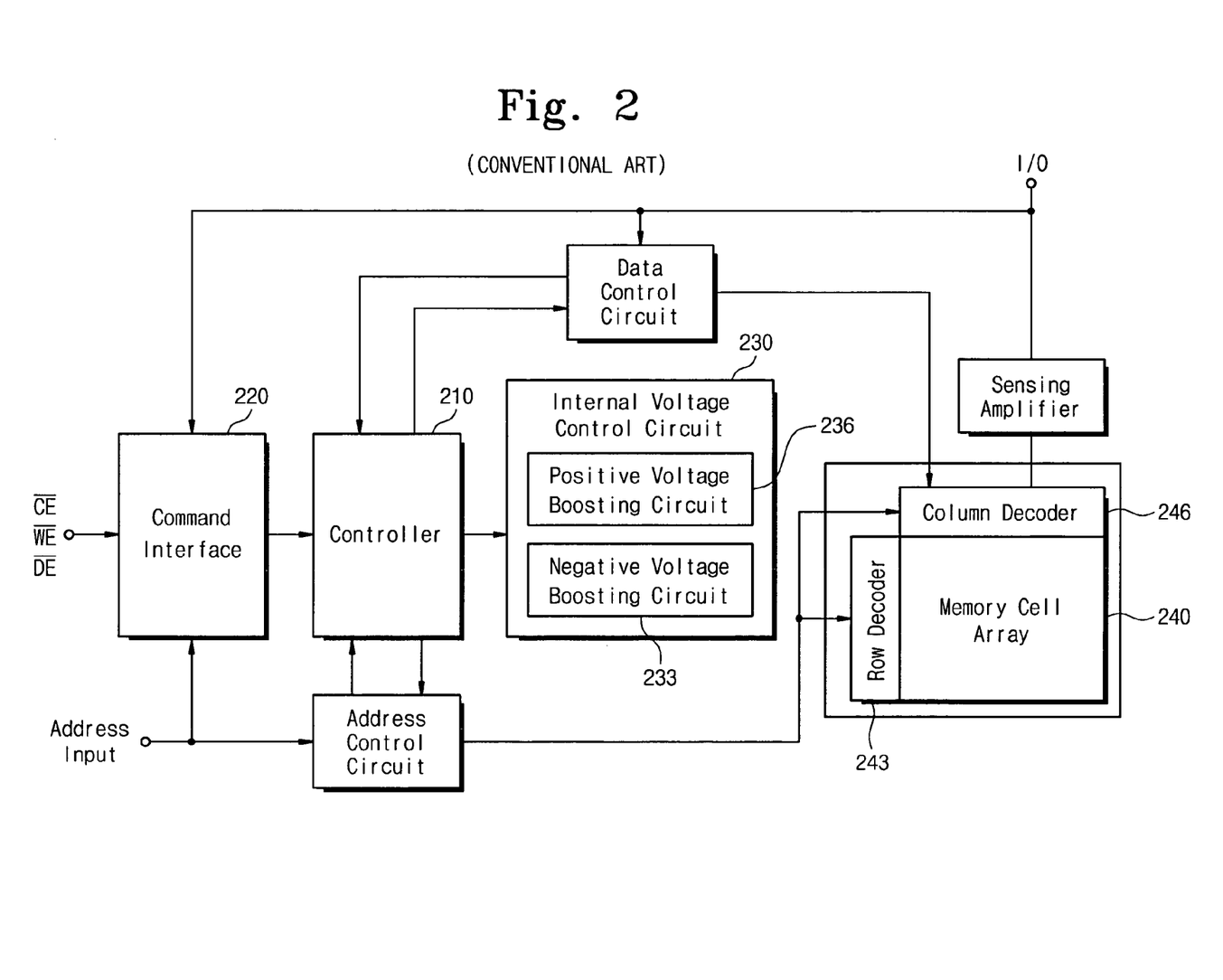
FIG. 2 is a block diagram illustrating an example structure of a conventional NOR flash memory device.

FIG. 2 is a block diagram illustrating an example structure of a NOR flash memory device. In FIG. 2, a controller 210 may perform programming sequence control, a read operation, and an erase operation based on a command decoded by a command interface 220. A boosted voltage obtained from an internal voltage control circuit 230 by boosting a power supply voltage may be used for programming and erasing data. The internal voltage control circuit 230 may be controlled by the controller 210 according to each operation mode. An output of the internal voltage control circuit 230 may be supplied to a word line or a bit line through a row decoder 243 or a column decoder 246 of a memory cell array 240.

The memory cell array 240 may include memory cells arranged in matrix form, and each memory cells may have a floating gate type field effect transistor (FET) connected to a word line and a bit line. A row decoder circuit may be used to drive a control gate of each memory cell. The floating gate type FET may include a source and a drain formed in a first conductivity type well provided in a second conductivity type well of a semiconductor substrate, a floating gate formed on the semiconductor substrate between the source and the drain with an insulating layer interposed therebetween, and a control gate formed on the floating gate with an insulating layer interposed therebetween. For example, the source and drain may be formed in a P-well provided in an N-well of the semiconductor substrate In an erase method of a flash memory, for example, in a substrate erase method, the controller 210 may control a negative voltage boosting circuit 233 and a positive voltage boosting circuit 236 of the internal voltage control circuit 230. For example, the controller 210 may set a gate voltage Vg to be a negative voltage (for example, approximately −9V), control opening of the source and the drain, and set a substrate voltage Vb to be a positive voltage (for example, from approximately 5V to approximately 9V) so that electrons accumulated in the floating gate may be discharged to the substrate. After the accumulated electrons are discharged for a given amount time, the controller 210 may control a negative voltage discharge circuit (not shown) so that a word line voltage may be restored to 0V, thereby ending the erase operation.

Figure 4:
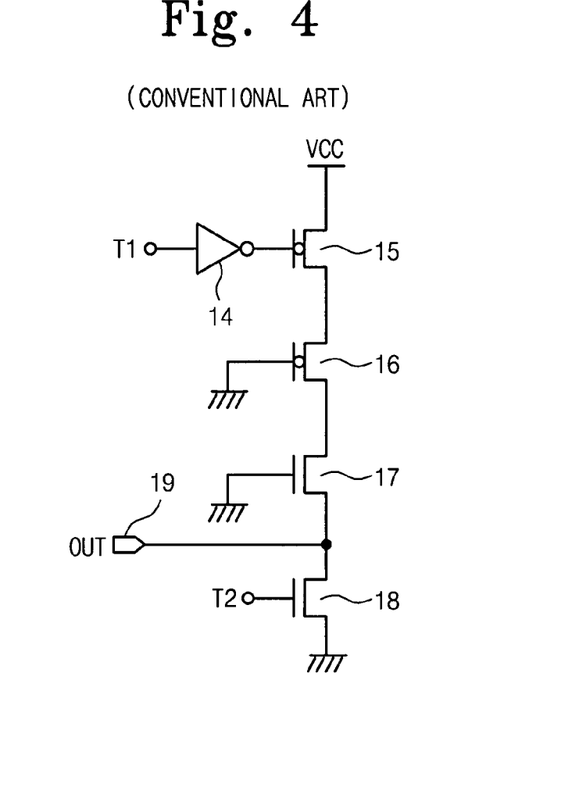
FIG. 4 is a circuit diagram of a conventional negative potential discharge circuit.

FIG. 4 is an example circuit diagram of a negative potential discharge circuit. In FIG. 4, first and second PMOS transistors 15 and 16 and first and second NMOS transistors 17 and 18 may be connected in series. A source of the first PMOS transistor 15 may be connected to a power supply terminal and a source of the second NMOS transistor 18 may be connected to a ground terminal. A gate of the first PMOS transistor 15 may be connected to an output terminal of an inverter 14, and a first discharge timing signal T1 may be input to an input terminal of the inverter 14. Gates of the second PMOS transistor 16 and the first NMOS transistor 17 may be connected to the ground terminal. A second discharge timing signal T2 may be input to a gate of the second NMOS transistor 18. A drain of the second NMOS transistor 18 may be connected to an output terminal 19.

In the example negative potential discharge circuit of FIG. 4, the output terminal 19 may be connected to a load charged to a negative potential, and the negative potential may be discharged to approximately 0V. For example, when the first discharge timing signal T1 is input to the input terminal of the inverter 14, the first PMOS transistor 15 may be turned on. Simultaneously, the second PMOS transistor 16 and the first NMOS transistor 17, which may be used to protect against a withstand voltage, may be turned on. Therefore, the negative potential of the load may be discharged to the power supply voltage Vcc. The discharge may stop at a level which may be lowered by a threshold voltage Vth of the first NMOS transistor 17. For example, the discharge may stop at −Vth. When the second discharge timing signal T2 is input to the gate of the second NMOS transistor 18, the potential of the load may be discharged to ground, and this discharge may stop at approximately 0V.

A discharge rate of the load may be determined based on sizes of the first PMOS transistor 15 and the first and second NMOS transistors 17 and 18. However, when the power supply voltage Vcc supplied externally changes, this may affect the discharge rate. For example, when a word line of a NOR flash memory is discharged, N-well/bulk potential coupling may make it difficult to discharge at a constant rate and prevent overshoot.

SUMMARY

Example embodiments are directed to a negative potential discharge circuit and method thereof for discharging at a constant rate despite changes in an externally applied power supply voltage.

According to an example embodiment, a negative potential discharge circuit may include an internal voltage generating circuit and/or a discharge unit. The internal voltage generating circuit may be configured to generate a regulated output voltage based on a power supply voltage. The discharge unit may be configured to discharge a negative potential using the regulated output voltage.

The discharge unit may include a level shifter configured to shift a level of a first discharge timing signal by dividing the regulated output voltage. The discharge unit may also include an inverter, first and second NMOS and PMOS transistors, and/or an output terminal. The inverter may invert an output of the level shifter. The first PMOS transistor may include a source connected to the internal voltage generating circuit and a gate connected to the inverter. The second PMOS transistor may include a source connected to a drain of the first PMOS transistor and a gate connected to a ground terminal. The first NMOS transistor may include a drain connected to a drain of the second PMOS transistor and a gate connected to the ground terminal. The second NMOS transistor may include a drain connected to a source of the first NMOS transistor, a gate receiving a second discharge timing signal, and a source connected to a ground terminal. The output terminal may be connected to the drain of the second NMOS transistor.

The internal voltage generating circuit may include a charge pump and/or a limiter. The charge pump may be configured to generate the output voltage by boosting the power supply voltage. The limiter may monitor the output voltage and be configured to limit the charge pump when the output voltage reaches a desired voltage by comparing a given fraction of the output voltage with a reference voltage, and to maintain the desired output voltage through a discharge when the output voltage exceeds the desired output voltage.

The internal voltage generating circuit may output the regulated output voltage through a regulator by boosting the power supply voltage using a charge pump. The reference voltage may be generated based on a band-gap reference, for example.

The negative potential discharge circuit may be connected to a negative power supply terminal of a row decoder of a NOR flash memory, and may discharge accumulated charges in a word line to a desired voltage level.

The second discharge timing signal may be activated when an absolute value of a word line voltage is discharged to a desired voltage. The first discharge timing signal may be activated when an erase operation is terminated. The second discharge timing signal may be deactivated with the lapse of a given amount of time. The first discharge signal may be deactivated simultaneously with one of the activation or deactivation of the second discharge timing signal. The absolute value of the given voltage may be set greater than a threshold value of the first NMOS transistor.

According to another example embodiment, a method of discharging a negative potential may include generating a regulated output voltage based on a power supply voltage, and/or discharging a negative potential using the regulated output voltage.

Discharging the negative potential may include shifting a level of a first discharge timing signal by dividing the regulated output voltage.

Generating the regulated output voltage may include boosting the power supply voltage using a charge pump, limiting the charge pump when the output voltage reaches a desired voltage by comparing a given fraction of the output voltage with a reference voltage, and maintaining the desired output voltage through a discharge when the output voltage exceeds the desired output voltage.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
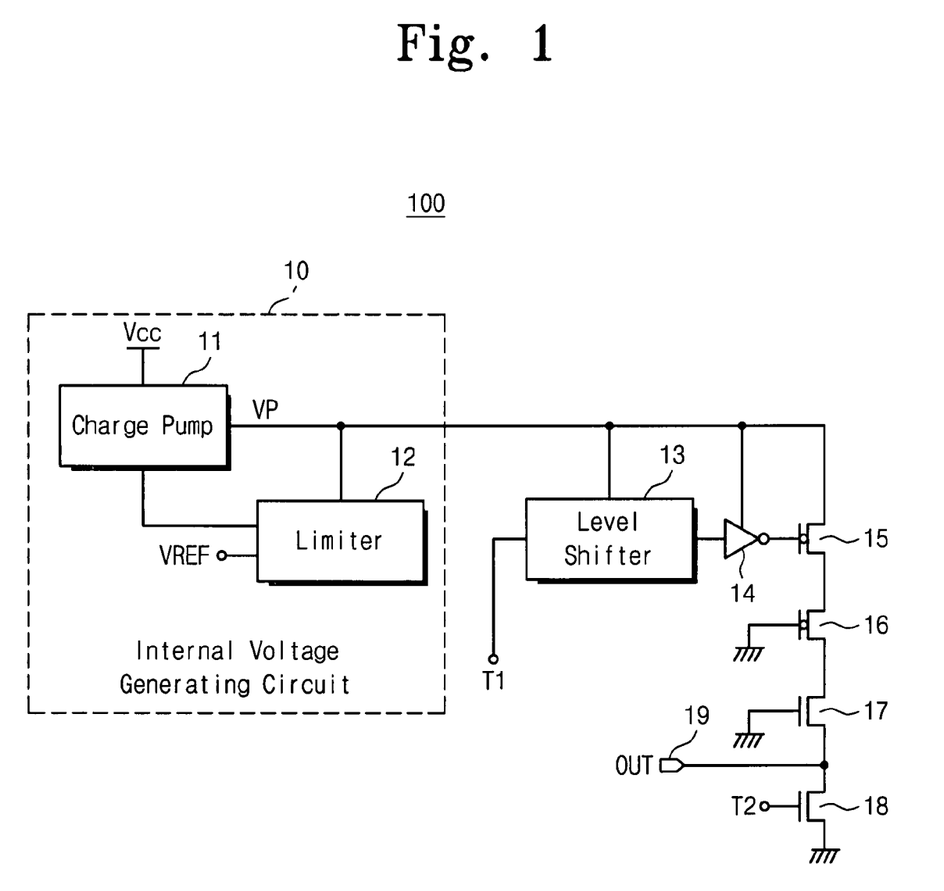
FIG. 1 is a circuit diagram of a negative potential discharge circuit according an example embodiment.

FIG. 1 is a circuit diagram of a negative potential discharge circuit according to an example embodiment. Referring to FIG. 1, a negative potential discharge circuit 100 may include an internal voltage generating circuit 10, a level shifter 13, an inverter 14, first and second PMOS transistors 15 and 16, first and second NMOS transistors 17 and 18, and/or an output terminal 19. The level shifter 13, inverter 14, first and second PMOS transistors 15 and 16, first and second NMOS transistors 17 and 18, and output terminal 19 may collectively form a discharge unit of the potential discharge circuit 100.

The internal voltage generating circuit 10 may output a relatively high voltage based on a power supply voltage, which may be supplied externally. The level shifter 13 may be connected to the internal voltage generating circuit 10 and receive a first discharge timing signal T1. The level shifter 13 may shift the first discharge timing signal T1 to a level of a division voltage obtained by dividing the relatively high voltage from the internal voltage generating circuit 10. Thus, the reference voltage may be compared to an appropriate fraction of the output voltage allowing a wide range of reference voltages to be used. The inverter 14 may invert the output of the level shifter 13.

The first PMOS transistor 15 may include a source connected to the internal voltage generating circuit 10 and a gate connected to the inverter 14. The second PMOS transistor 16 may include a source connected to a drain of the first PMOS transistor 15 and a gate connected to a ground terminal. The first NMOS transistor 17 may include a drain connected to a drain of the PMOS transistor 16 and a gate connected to the ground terminal. The second NMOS transistor 18 may include a drain connected to a source of the first NMOS transistor 17, a gate receiving a second discharge timing signal T2, and a source connected to the ground terminal. The output terminal 19 may be connected to the drain of the second NMOS transistor 18.

The internal voltage generating circuit 10 may include a charge pump 11, and a limiter 12 monitoring an output voltage VP. The charge pump 11 may be connected to a power supply terminal and boost a power supply voltage Vcc to output the boosted voltage as the output voltage VP. The limiter 12 may compare a division voltage of the output voltage VP with a reference voltage VREF to determine the desired output voltage of the internal voltage generating circuit 10. When the output voltage VP reaches the desired output voltage level, the limiter 12 may stop operation of the charge pump 11. When the output voltage VP exceeds the desired output voltage, the limiter 12 may discharge the output voltage VP to maintain the desired output voltage. The output voltage VP of the internal voltage generating circuit 10 may be the boosted voltage generated by the charge pump 11 or a given voltage generated from the power supply voltage Vcc using a regulator.

Figure 6:
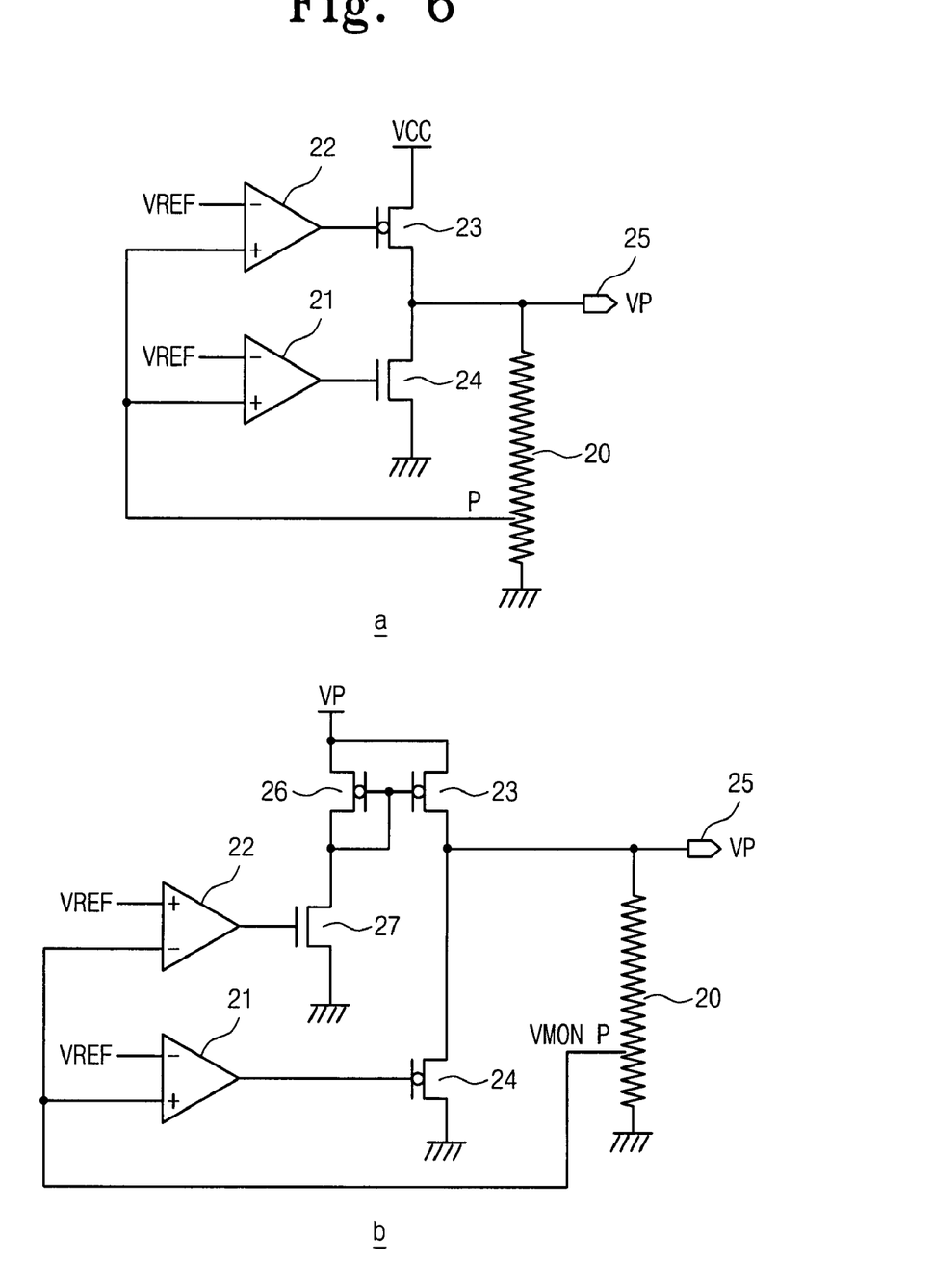
FIGS. 6A and 6B are circuit diagrams illustrating example structures of internal voltage generating circuits.

FIGS. 6A and 6B are circuit diagrams illustrating example structures of internal voltage generating circuits. In FIG. 6A, a reference voltage VREF may be input to inverting input terminals of first and second operational amplifiers 21 and 22. Non-inverting input terminals may be connected to each other and connected to a middle tap P of a resistor 20. A PMOS transistor 23 may include a source connected to a power supply terminal, and a gate connected to an output terminal of the second operational amplifier 22. The NMOS transistor 24 may include a drain connected to a drain of the PMOS transistor 23, a gate connected to an output terminal of the first operational amplifier 21, and a source connected to the ground terminal. The resistor 20 may be connected between the drain of an NMOS transistor 24 and the ground terminal. An output terminal 25 may be connected to the drain of the NMOS transistor 24.

The first and second operational amplifiers 21 and 22 may compare a division voltage obtained by dividing a voltage of the output terminal 25 at the middle tap P of the resistor 20 with the reference voltages VREF. The middle tap P is not intended to necessarily divide the voltage of the output terminal 25 in half, but may divide the voltage at any desired fraction. Thus, the first and second operational amplifiers 21 and 22 may control the PMOS transistor 23 and the NMOS transistor 24 based on the comparison results so that a desired voltage is output to the output terminal 25 as the output voltage VP.

Referring to FIG. 6B, a PMOS transistor 26 and an NMOS transistor 27 may be additionally provided to the circuit of FIG. 6A. In FIG. 6B, the NMOS transistor 27 may receive the output of the second operational amplifier 22, and be connected to the PMOS transistor 26. Thus, a given current flowing through a current path via the NMOS and PMOS transistors 27 and 26 may similarly flow through the PMOS transistor 23, resulting in outputting a desired voltage to the output terminal 25 as the output voltage VP. Since a boosted voltage VP obtained by boosting a power supply voltage Vcc using a charge pump is applied to the sources of the PMOS transistors 23 and 26, the example internal voltage generating circuit of FIG. 6B may discharge a higher voltage than the power supply voltage Vcc, as compared to the example circuit of FIG. 6A.

Figure 5:
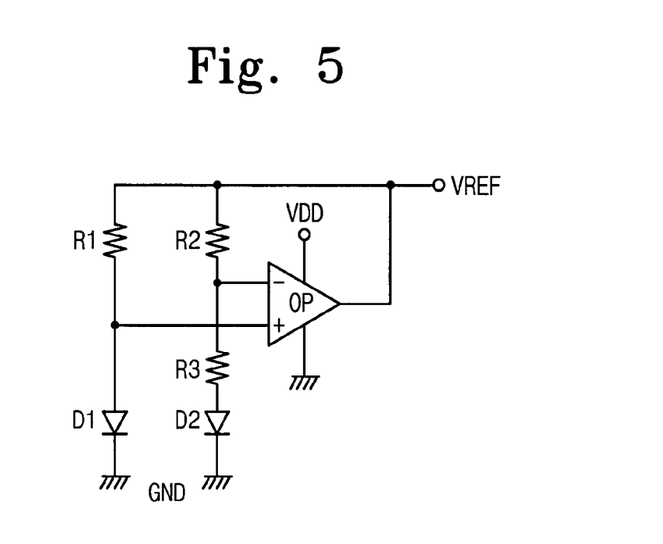
FIG. 5 is a circuit diagram of an example band-gap reference circuit.

FIG. 5 is a circuit diagram of an example band-gap reference circuit. When a band-gap reference circuit generates a reference voltage VREF, a constant voltage may be obtained despite changes in power supply voltage or temperature. As shown, a resistor R1 may be connected to an output terminal and a non-inverting input terminal of an operational amplifier OP. A resistor R2 may be connected to the output terminal and an inverting input terminal of the operational amplifier OP. A diode D1 may be connected to the non-inverting input terminal and a ground terminal with an anode coupled to the non-inverting input terminal. A resistor R3 and a diode D2 may be connected in series between the inverting input terminal and the ground terminal, in which a cathode of the diode D2 may be coupled to the ground terminal. A constant voltage level may be obtained from an output terminal despite changes in voltage and temperature by setting sizes of the diodes D1 and D2 and resistances of the resistors R1, R2 and R3 appropriately.

In the example circuit of FIG. 1, the output terminal 19 may be connected to a load charged to a negative potential higher than the power supply voltage Vcc. The negative potential may be discharged to approximately 0V. When the first discharge timing signal T1 is input to an input terminal of the level shifter 13, the level shifter 13 may shift the first discharge timing signal T1 to a level of a division voltage obtained by dividing the voltage VP. The inverter 14 may invert an output of the level shifter 13 and output the inverted signal to the first PMOS transistor 15 so that the first PMOS transistor 15 may be turned on.

The second PMOS transistor 16 and the first NMOS transistor 17, which may be used for protecting against a withstand voltage, may also be turned on. Therefore, the negative potential of the load may be discharged to the power supply voltage Vcc. This discharge may stop at a level corresponding to a threshold voltage Vth of the first NMOS transistor 17. For example, the discharge may stop at −Vth. When the second discharge timing signal T2 is input to the gate of the second NMOS transistor 18, the load may be discharged further to ground, and the discharge may stop at approximately 0V. Since an output voltage VP of the internal voltage generating circuit 10 may maintain a constant voltage despite changes in an external power supply voltage, negative charges may be discharged at a relatively constant rate.

Figure 3:
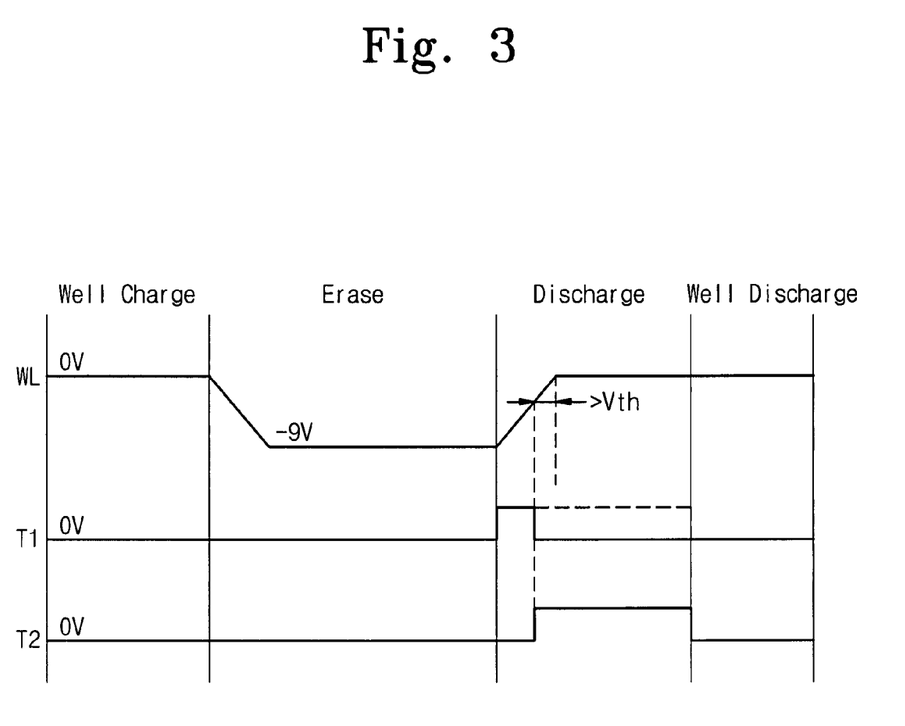
FIG. 3 is a timing diagram illustrating example timing of a negative potential discharge circuit according to an example embodiment.

FIG. 3 illustrates a timing diagram of a word line discharged in response to the first and second discharge timing signals T1 and T2 output from a controller for the example case when the negative potential discharge circuit 100 of FIG. 1 is used in conjunction with the internal voltage control circuit of the NOR flash memory of FIG. 2. In FIG. 3, during a well charge operation, the first and second discharge timing signals T1 and T2, and the word line voltage may be at a zero potential, but wells of the NOR flash memory may be charged to a desired level.

During an erase operation, the internal voltage control circuit 230 may supply approximately −9V to the word line for the erase operation. The first and second discharge timing signals T1 and T2 may maintain a zero potential during this time. During a word line discharge operation, the first discharge timing signal T1 may be activated by the controller 210. When the word line reaches approximately −Vth, the level corresponding to the threshold value Vth of the first NMOS transistor 17, the discharge may stop. Subsequently, the second discharge timing signal T2 may be activated and the word line discharged to ground by the second NMOS transistor 18. When the word line voltage reaches 0V, the discharge may stop.

The controller 210 may control the first discharge timing signal T1 such that the first discharge timing signal T1 is activated when the erase operation is terminated but deactivated when an absolute value of the word line voltage reaches the threshold value Vth of the first NMOS transistor 17. Also, the controller 210 may control the second discharge timing signal T2 such that the second discharge timing signal T2 is activated when the absolute value of the word line voltage reaches the threshold value Vth of the first NMOS transistor 17 but is deactivated after a given amount of time. Alternatively, the first discharge timing signal T1 may be activated when the erase operation is terminated, and the second discharge timing signal T2 may be activated when the absolute value of the word line voltage reaches the threshold value of the first NMOS transistor 17, but the first and second discharge timing signals T1 and T2 may be deactivated at the same time with the lapse of a given amount of time. Thus, negative charges may be discharged at a constant rate without being affected by changes in a power supply voltage.

Comparing the threshold value of the first NMOS transistor 17 with the absolute value of the word line voltage may include detecting the word line voltage using the controller 210 through the internal voltage control circuit 230, and comparing the detected voltage with the threshold value Vth of the first NMOS transistor 17 set by the controller 230 (not shown). The value may be set larger than the threshold value Vth of the first NMOS transistor 17.

As described above, negative charges may be discharged at a relatively constant rate without being affected by changes of an external voltage. Additionally, the discharge characteristic of an erase voltage may be improved in NOR flash memory and a discharge time reduced.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A negative potential discharge circuit, comprising: an internal voltage generating circuit configured to generate a regulated output voltage based on a power supply voltage; and a discharge unit configured to discharge a negative potential using the regulated output voltage, the discharge unit includes a level shifter configured to shift a level of a first discharge timing signal by dividing the regulated output voltage;
an inverter inverting an output of the level shifter; a first PMOS transistor including a source connected to the internal voltage generating circuit and a gate connected to the inverter; a second PMOS transistor including a source connected to a drain of the first PMOS transistor and a gate connected to a ground terminal; a first NMOS transistor including a drain connected to a drain of the second PMOS transistor and a gate connected to the ground terminal; a second NMOS transistor including a drain connected to a source of the first NMOS transistor, a gate receiving a second discharge timing signal, and a source connected to a ground terminal; and an output terminal connected to the drain of the second NMOS transistor.

2. The negative potential discharge circuit of claim 1, wherein the internal voltage generating circuit includes: a charge pump configured to generate the output voltage by boosting the power supply voltage; and a limiter monitoring the output voltage configured to limit the charge pump when the output voltage reaches a desired voltage by comparing a given fraction of the output voltage with a reference voltage, and to maintain the desired output voltage through a discharge when the output voltage exceeds the desired output voltage.

3. The negative potential discharge circuit of claim 2, wherein the negative potential discharge circuit is connected to a negative power supply terminal of a row decoder of a NOR flash memory, and discharges accumulated charges in a word line to a desired voltage level.

4. The negative potential discharge circuit of claim 3, wherein the second discharge timing signal is activated when an absolute value of a word line voltage is discharged to a desired voltage, the first discharge timing signal is activated when an erase operation is terminated, the second discharge timing signal is deactivated with the lapse of a given amount of time, and the first discharge signal is deactivated simultaneously with one of the activation or deactivation of the second discharge timing signal, where the absolute value of the given voltage is set greater than a threshold value of the first NMOS transistor.

5. The negative potential discharge circuit of claim 1, wherein the internal voltage generating circuit outputs the regulated output voltage through a regulator by boosting the power supply voltage using a charge pump.

6. The negative potential discharge circuit of claim 5, wherein the reference voltage is generated based on a bandgap reference.

7. The negative potential discharge circuit of claim 6, wherein the negative potential discharge circuit is connected to a negative power supply terminal of a row decoder of a NOR flash memory, and discharges accumulated charges in a word line to a desired voltage level.

8. The negative potential discharge circuit of claim 7, wherein the second discharge timing signal is activated when an absolute value of a word line voltage is discharged to a desired voltage, the first discharge timing signal is activated when an erase operation is terminated, the second discharge timing signal is deactivated with the lapse of a given amount of time, and the first discharge signal is deactivated simultaneously with one of the activation or deactivation of the second discharge timing signal, where the absolute value of the given voltage is set greater than a threshold value of the first NMOS transistor.

9. The negative potential discharge circuit of claim 3, wherein the negative potential discharge circuit is connected to a negative power supply terminal of a row decoder of a NOR flash memory, and discharges accumulated charges in a word line to a desired voltage level.

10. The negative potential discharge circuit of claim 9, wherein the second discharge timing signal is activated when an absolute value of a word line voltage is discharged to a desired voltage, the first discharge timing signal is activated when an erase operation is terminated, the second discharge timing signal is deactivated with the lapse of a given amount of time, and the first discharge signal is deactivated simultaneously with one of the activation or deactivation of the second discharge timing signal, where the absolute value of the given voltage is set greater than a threshold value of the first NMOS transistor.

11. The negative potential discharge circuit of claim 1, wherein the reference voltage is generated based on a bandgap reference.

12. The negative potential discharge circuit of claim 11, wherein the negative potential discharge circuit is connected to a negative power supply terminal of a row decoder of a NOR flash memory, and discharges accumulated charges in a word line to a desired voltage level.

13. The negative potential discharge circuit of claim 12, wherein the second discharge timing signal is activated when an absolute value of a word line voltage is discharged to a desired voltage, the first discharge timing signal is activated when an erase operation is terminated, the second discharge timing signal is deactivated with the lapse of a given amount of time, and the first discharge signal is deactivated simultaneously with one of the activation or deactivation of the second discharge timing signal, where the absolute value of the given voltage is set greater than a threshold value of the first NMOS transistor.

14. The negative potential discharge circuit of claim 1, wherein the negative potential discharge circuit is connected to a negative power supply terminal of a row decoder of a NOR flash memory, and discharges accumulated charges in a word line to a desired voltage level.

15. The negative potential discharge circuit of claim 14, wherein the second discharge timing signal is activated when an absolute value of a word line voltage is discharged to a desired voltage, the first discharge timing signal is activated when an erase operation is terminated, the second discharge timing signal is deactivated with the lapse of a given amount of time, and the first discharge signal is deactivated simultaneously with one of the activation or deactivation of the second discharge timing signal, where the absolute value of the given voltage is set greater than a threshold value of the first NMOS transistor.

16. A method of discharging a negative potential, comprising:
   generating a regulated output voltage based on a power supply voltage; and
   discharging a negative potential using the regulated output voltage, wherein generating the regulated output voltage includes: boosting the power supply voltage using a charge pump; limiting the charge pump when the output voltage reaches a desired voltage by comparing a given fraction of the output voltage with a reference voltage; and
   maintaining the desired output voltage through a discharge when the output voltage exceeds the desired output voltage.

17. The method of claim 16, wherein discharging the negative potential includes shifting a level of a first discharge timing signal by dividing the regulated output voltage.

* * * * *